(12) United States Patent
Iwakiri et al.

(10) Patent No.: US 8,664,607 B2
(45) Date of Patent: Mar. 4, 2014

(54) RADIOLOGICAL IMAGE DETECTION APPARATUS AND METHOD OF MANUFACTURING THE SAME

(75) Inventors: Naoto Iwakiri, Kanagawa (JP); Haruyasu Nakatsugawa, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 13/403,901

(22) Filed: Feb. 23, 2012

(65) Prior Publication Data

US 2012/0217405 A1 Aug. 30, 2012

(30) Foreign Application Priority Data

Feb. 25, 2011 (JP) ................................. 2011-040882

(51) Int. Cl.
*G01T 1/20* (2006.01)
(52) U.S. Cl.
USPC ..................................................... 250/361 R
(58) Field of Classification Search
USPC ................... 250/361 R, 367, 370.09, 370.11
See application file for complete search history.

(56) References Cited

U.S. PATENT DOCUMENTS

| 7,265,371 | B2 * | 9/2007 | Shoji et al. ..................... 250/581 |
| 7,391,029 | B2 * | 6/2008 | Takeda et al. ............. 250/370.11 |
| 7,521,685 | B2 * | 4/2009 | Hennessy et al. ........ 250/370.11 |
| 2005/0211917 | A1 * | 9/2005 | Fukui et al. ................ 250/484.4 |
| 2011/0006213 | A1 | 1/2011 | Sato et al. |

FOREIGN PATENT DOCUMENTS

| JP | 07-027864 | 1/1995 |
| JP | 2011-017683 A | 1/2011 |

* cited by examiner

*Primary Examiner* — David Porta
*Assistant Examiner* — Faye Boosalis
(74) *Attorney, Agent, or Firm* — Studebaker & Brackett PC

(57) ABSTRACT

A radiological image detection apparatus includes: a phosphor which contains fluorescent material emitting fluorescence in response to radiation exposure; a sensor portion of thin-film type that is provided adjacent to a radiation entering side of the phosphor and supported by the phosphor and that detects fluorescence emitted by the phosphor; and a moisture preventing portion that covers at least a part of a rear face opposite to a phosphor side of the sensor portion so as to suppress entering of moisture into the sensor portion.

23 Claims, 7 Drawing Sheets

RADIOLOGICAL IMAGE DETECTION APPARATUS AND METHOD OF MANUFACTURING THE SAME

CROSS-REFERENCE TO RELATED APPLICATIONS

This application is based on and claims priority under 35 USC 119 from Japanese Patent Application No. 2011-040882 filed on Feb. 25, 2011; the entire content of which is incorporated herein by reference.

BACKGROUND

1. Technical Field

The invention relates to a radiological image detection apparatus and a method of manufacturing the same.

2. Related Art

In recent years, radiological image detection apparatuses employing an FPD (Flat Panel Detector) for detecting a radiological image and generating digital image data are utilized in practice, and spreading rapidly because the image can be checked immediately in comparison with the case of a conventional imaging plate. Such radiological image detection apparatuses of various types are proposed. An example of this is an indirect conversion type.

A radiological image detection apparatus of indirect conversion type has: a scintillator (a phosphor) formed from fluorescent material such as CsI (cesium iodide) for emitting fluorescence in response to radiation exposure; and a sensor panel constructed such that a plurality of photoelectric conversion elements and switching devices of thin-film type are arranged in two dimensions on a substrate. Radiation transmitted through an image-taking object is converted into light by a scintillator in the radiation image conversion panel. Then, the fluorescence from the scintillator is converted into electric signals by the photoelectric conversion elements in the sensor panel.

Further, a radiological image detection apparatus of so-called front face reading (ISS: Irradiation Side Sampling) type is also proposed that is obtained by modifying a radiological image detection apparatus of indirect conversion type such that radiation enters from the sensor panel side (for example, see Patent Document 1 (JP-A-7-27864)). According to this radiological image detection apparatus, the intensity of fluorescence of the scintillator emitted near the sensor panel increases and hence sensitivity is improved. This reduces the amount of exposure necessary for detection of a radiation image, and hence reduces the amount of exposure in an image-taking object.

Further, a technique is also proposed that a scintillator is constructed in the form of a group of columnar crystals obtained by crystal growth of fluorescent material such as CsI into columnar shapes by gas-phase deposition or the like (for example, see Patent Document 2 (JP-A-2011-017683)). Columnar crystals formed by gas-phase deposition do not include impurities such as binder, and further provides a lightguide effect of guiding the emitted fluorescence along the direction of crystal growth and hence suppresses diffusion of the fluorescence. This improves the sensitivity of the radiological image detection apparatus and improves the sharpness of the image.

Here, in the radiological image detection apparatus of ISS type, radiation is transmitted through the substrate of the sensor panel and then enters the scintillator. The substrate of the sensor panel is typically composed of glass. Nevertheless, glass absorbs radiation in not a little amount. This causes a concern of attenuation of the radiation entering the scintillator. Thus, in the radiological image detection apparatus described in Patent Document 1, the substrate of the sensor panel is composed of a resin sheet having a lower radiation absorbing power than the glass. Alternatively, even when glass is employed, a glass sheet as thin as a few 100 μm or the like is adopted.

When the substrate of the sensor panel is removed, attenuation of the radiation entering the scintillator is suppressed further. Nevertheless, when the substrate is peeled off, the moisture prevention effect obtained by the substrate is lost. Then, moisture enters the thin film constituting the photoelectric conversion elements and the switching devices and causes a concern that the photoelectric conversion elements and the switching devices are degraded.

Further, a possibility arises that moisture permeates through the thin film constituting the photoelectric conversion elements and the switching devices and then enters the scintillator. The CsI constituting the scintillator has deliquescence Thus, moisture absorption causes degradation in the characteristics of the scintillator. For example, in the scintillator constructed from a group of columnar crystals of CsI, the columnar crystal structure is damaged by moisture absorption. Thus, the above-mentioned lightguide effect is lost and the sharpness of the image is degraded.

Further, in the case of presence of the substrate, deliquescence of the scintillator caused by the entering of moisture begins at the periphery. In contrast, in a case that the substrate is peeled off, the entering of moisture into the scintillator occurs in the entire surface of the scintillator. Thus, a possibility arises that deliquescence progresses after beginning at the center part of the scintillator which overlaps with the effective imaging region of the sensor panel. The center part of the scintillator plays a major role in radiation image detection. Thus, a concern arises that in order that the diagnostic accuracy based on the radiation image should be maintained, frequent replacement of the scintillator becomes necessary.

SUMMARY

An illustrative aspect of the invention is to provide a radiological image detection apparatus having satisfactory image quality and satisfactory durability.

(1) According to an aspect of the invention, a radiological image detection apparatus includes: a phosphor which contains fluorescent material emitting fluorescence in response to radiation exposure; a sensor portion of thin-film type that is provided adjacent to a radiation entering side of the phosphor and supported by the phosphor and that detects fluorescence emitted by the phosphor; and a moisture preventing portion that covers at least a part of a rear face opposite to a phosphor side of the sensor portion so as to suppress entering of moisture into the sensor portion.

(2) According to another aspect of the invention, a method of manufacturing the radiological image detection apparatus of (1), includes: bonding the phosphor to a sensor panel constructed such that the moisture preventing portion and the sensor portion are provided in this order on a substrate; and peeling off the substrate.

(3) According to another aspect of the invention, a method of manufacturing the radiological image detection apparatus of (1), includes: bonding the phosphor to a sensor panel constructed such that the sensor portion provided on a substrate; peeling off the substrate; and forming the moisture preventing portion onto a front face of the sensor portion exposed when the substrate is peeled off.

With the configuration, in the sensor portion of thin-film type, a substrate having supported the sensor portion is peeled off and hence the sensor portion is supported by the phosphor. This avoids absorption of radiation by the substrate, and hence avoids attenuation of the radiation entering the scintillator. Thus, the sensitivity of the radiological image detection apparatus is improved. Further, a moisture preventing portion is provided on the rear face of the sensor portion exposed when the substrate has been peeled off. This suppresses degradation of the sensor portion and the phosphor caused by moisture. Thus, image quality and durability are improved.

DETAILED DESCRIPTION

Figure 1:
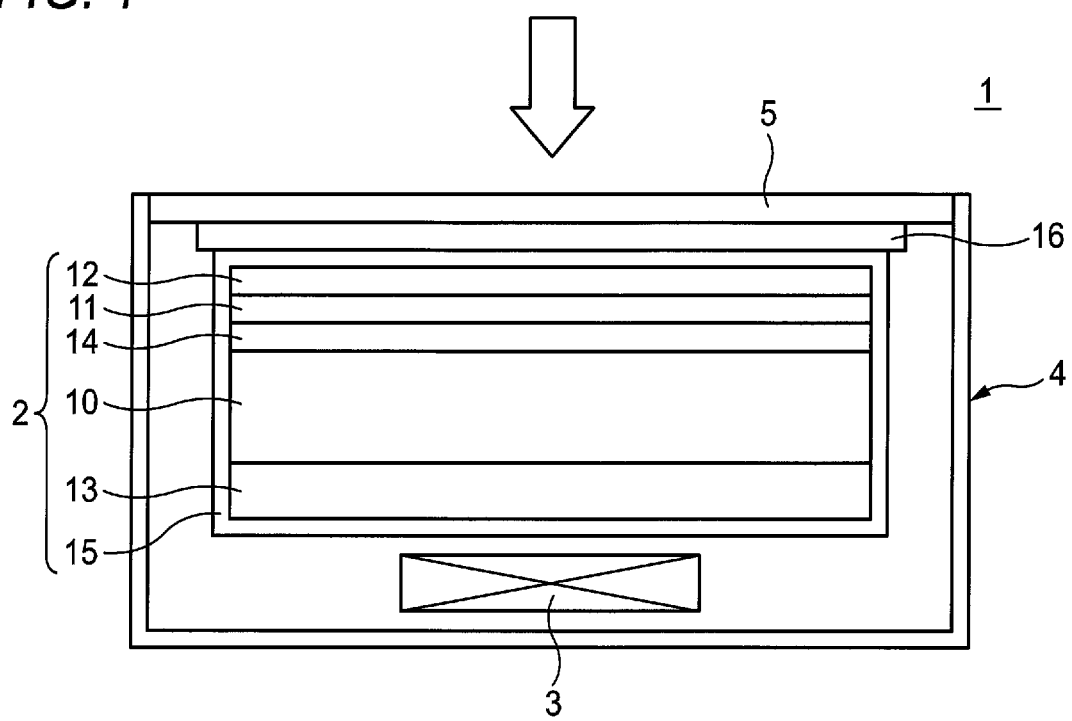
FIG. 1 is a diagram schematically showing a configuration of an example of a radiological image detection apparatus used for describing an exemplary embodiment of the invention.

FIG. 1 shows a configuration of an example of a radiological image detection apparatus used for describing an exemplary embodiment of the invention.

The radiological image detection apparatus 1 shown in FIG. 1 is a radiological image detection apparatus of portable type (referred to as a cassette, hereinafter). The cassette 1 has: a detection portion 2 for detecting a radiological image; a control portion 3 for controlling the operation of the detection portion 2 and emitting an image on the basis of the radiological image detected by the detection portion 2; and a casing 4 for accommodating the detection portion 2 and the control portion 3.

In the casing 4, a test object (e.g., an image-taking target part of a patient) is placed on a top plate 5 stacked on the detection portion 2. Then, radiation projected toward the test object is transmitted through the top plate 5 and then enters the detection portion 2. Thus, the top plate 5 is composed of a material having a low radiation absorbing power, and is fabricated typically from carbon fiber reinforced plastics or aluminum.

The detection portion 2 has: a scintillator (phosphor) 10 for emitting fluorescence in response to radiation exposure; a sensor portion 11 for detecting the fluorescence emitted by the scintillator 10; and a moisture preventing portion 12 for suppressing the entering of moisture into the sensor portion 11.

The scintillator 10 is constructed independently of the sensor portion 11, and is formed on a support 13. Then, in the scintillator 10, the surface on the side opposite to the support 13 is bonded to the sensor portion 11 with, in between, a resin layer 14 for optically linking the two materials.

The moisture preventing portion 12 is stacked on a surface on the side opposite to the scintillator 10, in the sensor portion 11 bonded to the scintillator 10.

The detection portion 2 constructed by stacking the support 13, the scintillator 10, the sensor portion 11, and the moisture preventing portion 12 as described above is integrally sealed by a protective film 15. In association with the sealing by the protective film 15, the moisture preventing portion 12 is pressed against the sensor portion 11. For example, the protective film 15 may preferably be a parylene film obtained by film formation by CVD.

Then, in the detection portion 2 sealed by the protective film 15 the surface on the moisture preventing portion 12 side is bonded to the top plate 5 with an adhesive layer 16 in between.

The cassette 1 of the present example is a radiological image detection apparatus of ISS type. Then, radiation having entered the detection portion 2 is transmitted through the moisture preventing portion 12 and the sensor portion 11 and then enters the scintillator 10. Fluorescence occurs in the scintillator 10 where the radiation has entered. Then, the fluorescence emitted here is detected by the sensor portion 11. The radiation entering side of the scintillator 10 where fluorescence is emitted at high intensities is located adjacent to the sensor portion 11. This improves the sensitivity.

Figure 2:
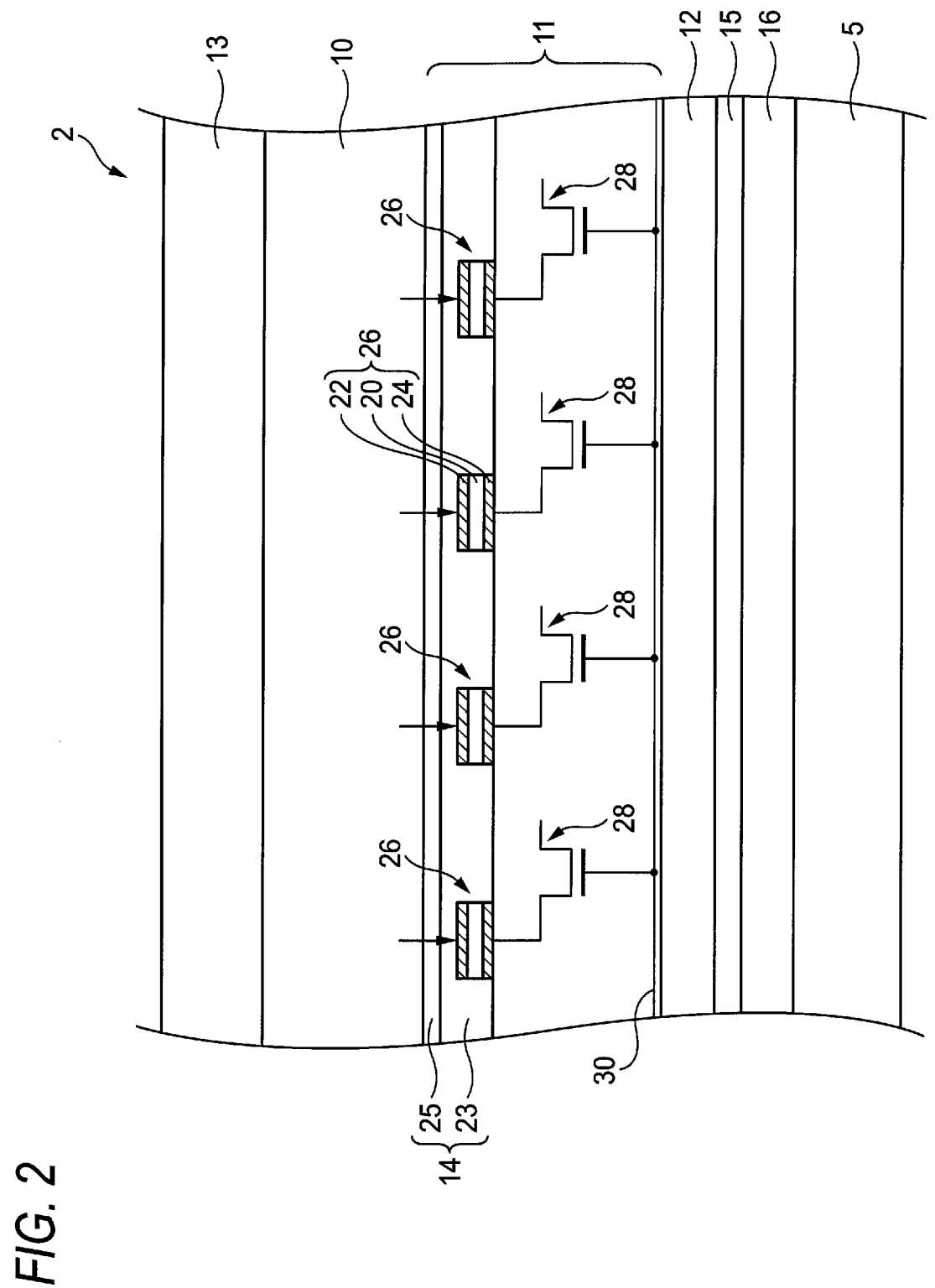
FIG. 2 is a diagram schematically showing a configuration of a detection portion of a radiological image detection apparatus shown in FIG. 1.
Figure 3:
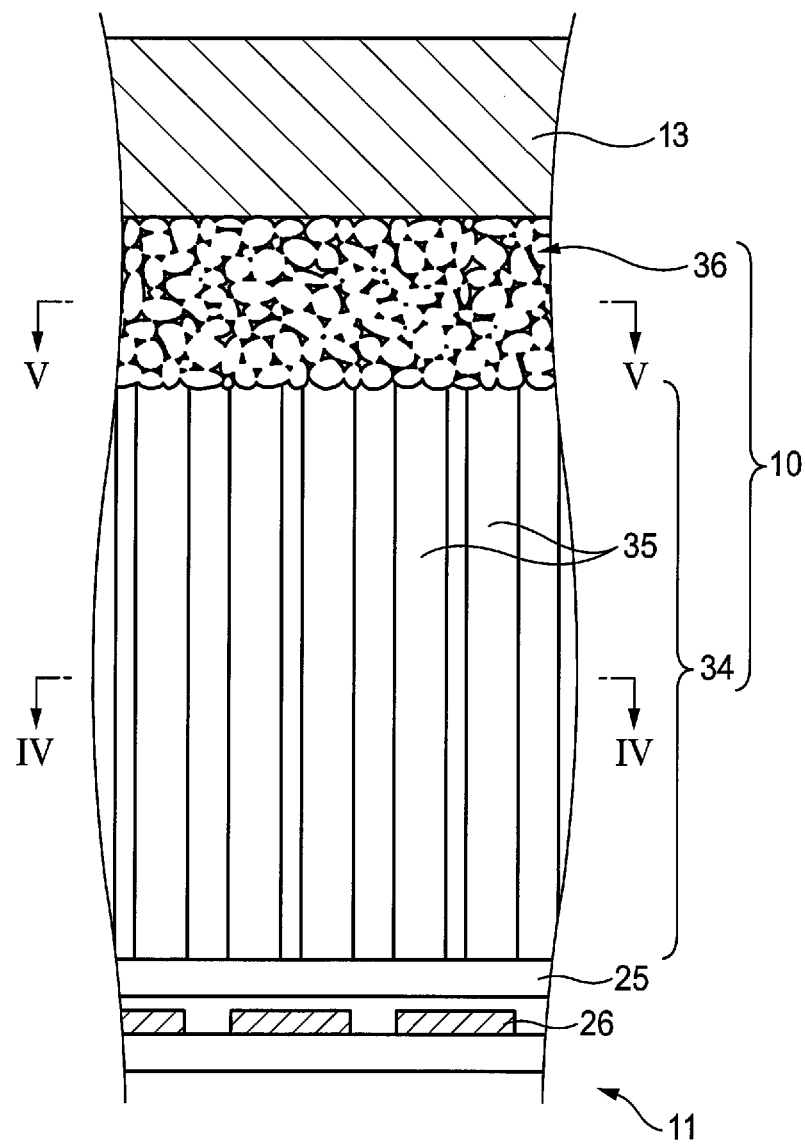
FIG. 3 is a diagram schematically showing a configuration of a phosphor of a detection portion shown in FIG. 2.

FIG. 2 shows the configuration of the detection portion 2 of the cassette 1. FIG. 3 schematically shows the configuration of the scintillator 10 of the detection portion 2.

Employable fluorescent materials for constituting the scintillator 10 include CsI:Tl (thallium-activated cesium iodide), NaI:Tl (thallium-activated sodium iodide), and CsI:Na (sodium-activated cesium iodide). Among these, CsI:Tl is preferable in the point that the emission spectrum matches with the maximal point (near 550 nm) in the spectral sensitivity of an a-Si photodiode.

The scintillator 10 is constructed from: a columnar portion 34 provided on the side opposite to the support 13; and a non-columnar portion 36 provided on the support 13 side. Although details are described later, the columnar portion 34 and the non-columnar portion 36 are formed continuously in the form of stacked layers on the support 13 by gas-phase deposition. Here, the columnar portion 34 and the non-columnar portion 36 are composed of the same fluorescent material. However, the amount of added activation agent such as Tl may be different from each other.

The columnar portion 34 is constructed from a group of columnar crystals 35 obtained by crystal growth of the above-mentioned fluorescent material into columnar shapes. Here, in some cases, a plurality of neighboring columnar crystals are linked together so as to form one columnar crystal. A gap is formed between adjacent columnar crystals 35, and hence the columnar crystals 35 are independent of each other.

The non-columnar portion 36 is constructed from a group of relatively small crystals of the fluorescent material. Here, in some cases, the non-columnar portion 36 contains amorphous material of the above-mentioned fluorescent material. In the non-columnar portion 36, the crystals are irregularly linked together or overlapped with each other and hence no clear gap is formed between the crystals.

In the scintillator 10, the surface on the side opposite to the support 13, that is, the surface on the tip side of each columnar crystal of the columnar portion 34 is bonded to the sensor portion 11. Thus, on the radiation entering side of the scintillator 10, the columnar portion 34 composed of the group of columnar crystals 35 is arranged.

The fluorescence emitted by the columnar crystals 35 is total-reflected repeatedly within each columnar crystal 35 by virtue of the refractive index difference between the columnar crystal 35 and the gap (air) in the surroundings, so that diffusion of the fluorescence is suppressed and the fluorescence is guided to the sensor portion 11. This improves the sharpness of the image.

Then, among the fluorescence emitted by the columnar crystal 35, the fluorescence traveling toward the side opposite to the sensor portion 11, that is, toward the support 13, is reflected toward the sensor portion 11 by the non-columnar portion 36. This improves the efficiency of fluorescence utilization and hence the sensitivity.

Further, the columnar crystal 35 is of relatively small diameter at an early stage of growth, and becomes of larger diameter as crystal growth progresses. In the region on the support 13 side of the columnar portion 34 which corresponds to the pedestal side of the columnar crystals 35, the columnar crystals 35 of small diameter stand densely and a large number of relatively large gaps extend in the direction of crystal growth. Thus, the void ratio is large. In contrast, the non-columnar portion 36 is constructed from relatively small crystals or alternatively an aggregate of these, and hence is denser and has a smaller void ratio than the region on the support 13 side of the columnar portion 34. Further, since the non-columnar portion 36 is provided between the support 13 and the columnar portion 34, close contact between the support 13 and the scintillator 10 is improved and peel-off of the scintillator 10 from the support 13 is avoided.

Figure 4:
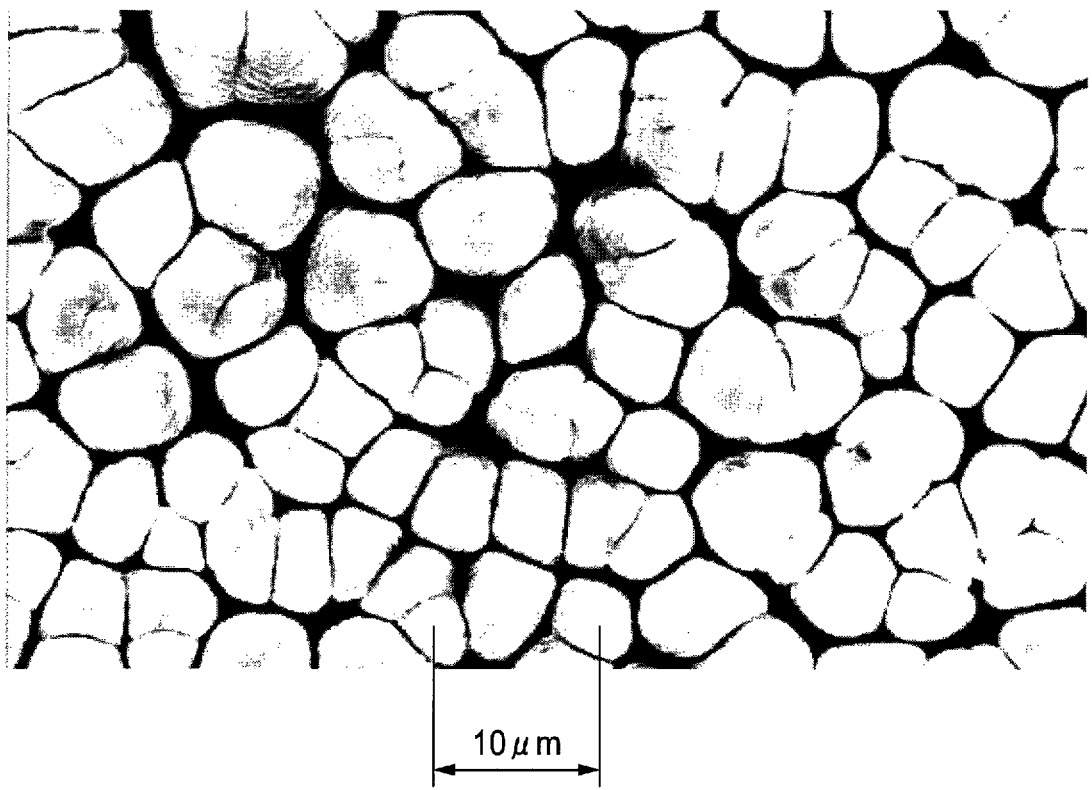
FIG. 4 is a diagram showing a cross section of a phosphor shown in FIG. 3, taken along line IV-IV.

FIG. 4 is an electron microscopy photograph showing the IV-IV cross section of the scintillator 10 shown in FIG. 3.

As seen from FIG. 4, in the columnar portion 34, the columnar crystals 35 have a cross portion of almost uniform diameter in the direction of crystal growth. Further, a gap is formed around each columnar crystal 35. Thus, the columnar crystals 35 stand independently of each other. Preferably, the crystal diameter (the pillar diameter) of the columnar crystal 35 is 2 µm or greater and 8 µm or smaller from the perspectives of the lightguide effect, the mechanical strength, and the picture-element defect prevention. An excessively small pillar diameter causes insufficiency in the mechanical strength of the columnar crystal 35. Thus, a concern of damage by a shock or the like arises. In contrast, an excessively large pillar diameter causes insufficiency in the number of columnar crystals 35 assigned to each pixel. Thus, a concern arises that when a crack occurs in a crystal, the pixel becomes defective at high probabilities.

Here, the pillar diameter indicates the maximum diameter of the crystal viewed from the upper face side in the growth direction of the columnar crystal 35. As a detailed measurement method, the pillar diameter is measured by observation of the columnar crystal 35 from the upper face side in the growth direction by using an SEM (scanning electron microscope). The observation is performed at a magnification factor (of approximately 2000) that allows observation of 100 to 200 columnar crystals 35. Then, the maximum value of pillar diameter is measured for each crystal contained in one image-taking frame. Then, the average value is calculated. The pillar diameter value (µm) is measured to the second digit below the decimal point. Then, a value obtained by rounding at the second digit below the decimal point is adopted as the average in accordance with JIS Z 8401.

Figure 5:
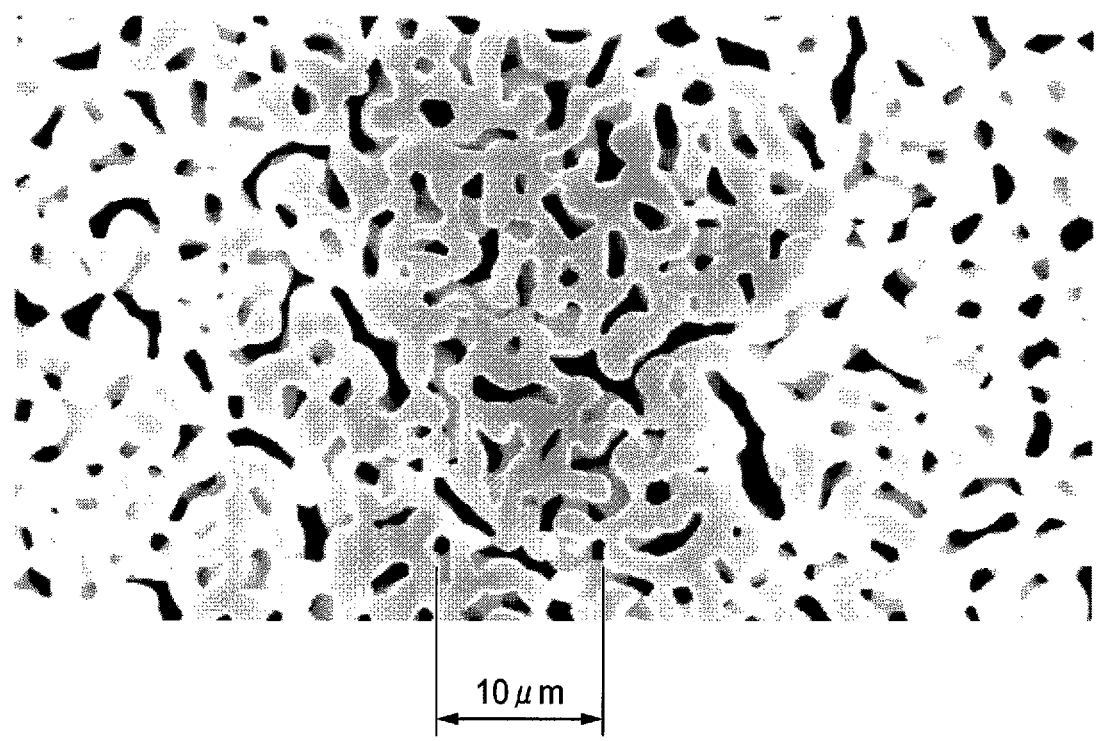
FIG. 5 is a diagram showing a cross section of a phosphor shown in FIG. 3, taken along line V-V.

FIG. 5 is an electron microscopy photograph showing the V-V cross section of the scintillator 10 shown in FIG. 3.

As seen from FIG. 5, in the non-columnar portion 36, the crystals are irregularly linked together or overlapped with each other. Thus, clear gaps between crystals are not seen in comparison with the situation in the columnar portion 34. Preferably, the diameter of the crystals constituting the non-columnar portion 36 is 0.5 µm or greater and 7.0 µm or smaller from the perspectives of close contact and light reflection. When the crystal diameter is excessively small, the gap approaches 0 and hence a concern arises that the function of light reflection is degraded. When the crystal diameter is excessively large, flatness is degraded and hence a concern arises that close contact with the support 13 is degraded. Further, preferably, the shape of each crystal constituting the non-columnar portion 36 is approximately spherical from the perspective of light reflection.

Here, measurement of the crystal diameter in a case that the crystals are linked together is performed as follows. Each line obtained by joining depressions (recesses) formed between adjacent crystals is regarded as a boundary between the crystals so that the linked crystals are separated into smallest polygons. Then, the pillar diameter and the crystal diameter corresponding to the pillar diameter are measured. Then, the average is calculated and adopted similarly to the method adopted for the crystal diameter in the columnar portion 34.

Further, preferably, the thickness of the columnar portion 34 is 200 µm or greater and 700 µm or smaller, although depending on the energy of radiation, from the perspectives of sufficient radiation absorption in the columnar portion 34 and the sharpness of the image. When the thickness of the columnar portion 34 is excessively small, the radiation is not sufficiently absorbed and hence a concern of degraded sensitivity arises. When the thickness is excessively great, light diffusion occurs and hence a concern arises that degradation in the sharpness of the image is not avoided even by the lightguide effect of the columnar crystal.

Preferably, the thickness of the non-columnar portion 36 is 5 µm or greater and 125 µm or smaller from the perspectives of close contact with the support 13 and light reflection. When the thickness of the non-columnar portion 36 is excessively small, a concern arises that sufficiently close contact with the support 13 is not obtained. When the thickness is excessively great, an increase occurs in the contribution of the fluorescence by the non-columnar portion 36 and in the diffusion caused by light reflection in the non-columnar portion 36. Thus, a concern of degradation in the sharpness of the image arises.

The material used for the support 13 is not limited to particular one as long as the scintillator 10 is allowed to be formed thereon. For example, the support 13 may be fabricated from a carbon plate, a CFRP (carbon fiber reinforced plastic), a glass plate, a quartz substrate, a sapphire substrate, or a metal sheet composed of material selected from iron, tin, chromium, aluminum, and the like. Among these, a metal sheet composed of aluminum or aluminum alloy is preferably employed that has reflectivity with respect to the fluorescence emitted by the columnar crystals of the scintillator 10.

When the support 13 is fabricated from a metal sheet composed of aluminum or aluminum alloy, among the fluorescence emitted by the columnar crystal 35, the fluorescence traveling toward the side opposite to the sensor portion 11, that is, toward the support 13, is reflected toward the sensor portion 11. This improves the efficiency of fluorescence utilization and hence the sensitivity. Here, even a carbon plate or the like other than a metal sheet composed of aluminum or aluminum alloy is employed, a similar effect is obtained when a coating film composed of aluminum or aluminum alloy is formed on the surface onto which the scintillator 10 is to be formed.

Further, the CsI constituting the scintillator 10 has a tendency that the sensitivity decreases with increasing temperature. The cassette 1 of the present example is of ISS type as described above. In this case, the control portion 3 is typically arranged behind the support 13 and hence the heat generated in the control portion 3 is transmitted to the support 13. Thus, when the support 13 is fabricated from a metal sheet composed of aluminum or aluminum alloy having a satisfactory thermal conductivity, the heat transmitted from the control portion 3 is diffused rapidly. This avoids local temperature rise in the scintillator 10 and local sensitivity degradation caused by this. Thus, occurrence of image non-uniformity is avoided.

The non-columnar portion 36 and the columnar portion 34 of the scintillator 10 are formed continuously and integrally in this order on the support 13 by gas-phase deposition or the like. Specifically, under the environment of a vacuum pressure of 0.01 to 10 Pa, CsI:Tl is heated and evaporated by means of energizing a resistance-heating type crucible. Then, in a state that the temperature of the support 13 is maintained in the range from a room temperature (20° C.) to 300° C., CsI:Tl is deposited on the support 13.

When CsI:Tl of crystal phase is to be formed on the support 13, first, crystals of relatively small diameter are deposited so that the non-columnar portion 36 is formed. Then, the columnar portion 34 is formed successively to the formation of the non-columnar portion 36, in a state that at least one condition selected from the vacuum pressure and the temperature of the support 13 is changed. Specifically, the group of columnar crystals 35 is grown in a state that the vacuum pressure is increased and/or the temperature of the support 13 is increased.

As described above, the scintillator 10 is fabricated efficiently and easily. Further, this fabrication method has an advantage that when the vacuum pressure and the support temperature are controlled, scintillators of various kinds of specifications are simply fabricated in accordance with the designs.

Figure 6:
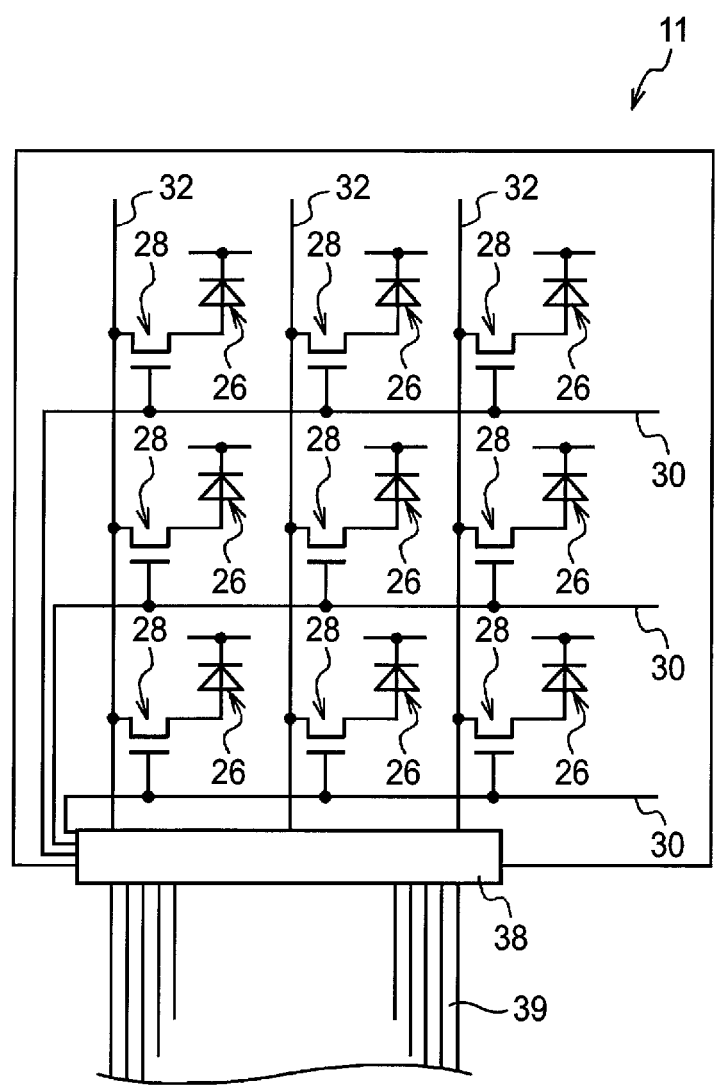
FIG. 6 is a diagram schematically showing a configuration of a sensor portion of a detection portion shown in FIG. 2.

Next, the sensor portion 11 is described below with reference to FIGS. 2 and 6. FIG. 6 shows the configuration of the sensor portion 11.

The sensor portion 11 has: a plurality of photoelectric conversion elements 26; and a plurality of switching devices 28 each composed of a thin-film transistor (TFT) for reading charge generated in each of the photoelectric conversion elements 26. Each photoelectric conversion element 26 is an element of thin-film type. Then, a photoconductive layer 20 for generating charge when fluorescence from the scintillator 10 is received is formed from a thin film composed of inorganic or organic photoelectric conversion material. These photoelectric conversion elements 26 and switching devices 28 are arranged in two dimensions.

Here, in the illustrated example, the array of photoelectric conversion elements 26 and the array of switching devices 28 are formed in different layers from each other. The array of photoelectric conversion elements 26 is arranged on the scintillator 10 side. Here, the array of photoelectric conversion elements 26 and the array of switching devices 28 may be formed in the same layer. Alternatively, the array of switching devices 28 and the array of photoelectric conversion elements 26 may be formed in this order from the scintillator 10 side. Then, as in the illustrated example, when the array of photoelectric conversion elements 26 and the array of switching devices 28 are formed in different layers from each other, the size of each photoelectric conversion element 26 is allowed to be large. Further, when the array of photoelectric conversion elements 26 and the array of switching devices 28 are formed in this order from the scintillator side, the photoelectric conversion elements 26 are allowed to be arranged closer to the scintillator 10. This improves the sensitivity.

On the array of photoelectric conversion elements 26, a flattening layer 23 is formed for covering these photoelectric conversion elements 26 so as to flatten the surface thereof. Further, an adhesive layer 25 for bonding the scintillator 10 with the sensor portion 11 is formed on the flattening layer 23. The flattening layer 23 and the adhesive layer 25 constitute the above-mentioned resin layer 14. Preferably, the thickness of the resin layer 14 is 50 μm or smaller and, more preferably, in the range from 5 μm to 30 μm from the perspectives of sensitivity and image sharpness.

Each photoelectric conversion element 26 is constructed from: a photoconductive layer 20 for generating charge when receiving the fluorescence from the scintillator 10; and a pair of electrodes provided respectively on the front and the rear surfaces of the photoconductive layer 20. The electrode 22 provided on the surface on the scintillator 10 side of the photoconductive layer 20 is a bias electrode used for applying a bias voltage on the photoconductive layer 20. The electrode 24 provided on the opposite side surface is a charge collecting electrode for acquiring the charge generated by the photoconductive layer 20. The charge collecting electrode 24 of the photoelectric conversion element 26 is connected to the corresponding one of the switching devices 28. The charge collected by each charge collecting electrode 24 is read through the switching device 28.

The layer in which the array of switching devices 28 is formed is provided with: a plurality of gate lines 30 extending in one direction (the row direction) and turning ON or OFF the individual switching devices 28; and a plurality of signal lines (data lines) 32 extending in the direction (the column direction) perpendicular to the gate lines 30 and reading the charge through the switching devices 28 in an ON state. Then, a connection terminal portion 38 connected to the gate lines 30 and the signal lines 32 is arranged in the periphery of the sensor portion 11. As shown in FIG. 2, the connection terminal portion 38 is connected through a connection circuit 39 to a circuit board (not shown) provided in the control portion 3 (see FIG. 1). This circuit board has a gate driver and a signal processing portion.

In response to signals provided from the gate driver through the gate lines 30, the switching devices 28 are turned ON row by row. Then, the charge read through each switching device 28 in the ON state is transmitted as a charge signal through the signal line 32, and then inputted to the signal processing portion. Thus, the charge is read sequentially row by row, and then converted into electric signals by the above-mentioned signal processing portion so that digital image data is generated.

In the sensor portion 11 having the above-mentioned configuration, the array of photoelectric conversion elements 26 and switching devices 28 is formed, for example, on an insulating substrate such as a glass substrate by using a publicly known film formation technique. Then, the sensor panel constructed such that the array of photoelectric conversion elements 26 and switching devices 28 is formed on the insulating substrate is bonded to the scintillator 10 with the adhesive layer 25 in between.

Then, the insulating substrate is peeled off from the above-mentioned sensor panel bonded to the scintillator 10. Then, in the scintillator 10, the array of photoelectric conversion elements 26 and switching devices 28 remains and constitutes the sensor portion 11. After the insulating substrate has been peeled off, the array of photoelectric conversion elements 26 and switching devices 28 of thin-film type is supported by the scintillator 10. Here, an appropriate peel-off layer may be formed on the insulating substrate and then the array of photoelectric conversion elements 26 and switching devices 28 may be formed thereon so that the above-mentioned sensor panel may be constructed. This permits easy peel-off of the insulating substrate.

Next, the moisture preventing portion 12 is described below with reference to FIG. 2.

The moisture preventing portion 12 is formed from a moisture absorbing material having insulation, and is provided such as to cover a region including at least the rear face center part of the sensor portion 11. In the illustrated example, the moisture preventing portion 12 is provided such as to cover the entire rear face of the sensor portion 11. Since the moisture preventing portion 12 is provided such as to cover a region including at least the rear face center part of the sensor portion 11, this suppresses the entering of moisture into the center part of the scintillator 10 playing a major role in radiation image detection and hence avoids the progress of deliquescence beginning at the center part of the scintillator 10.

Here, as described above, the cassette 1 of the present example is a radiological image detection apparatus of ISS type. Then, radiation having entered the detection portion 2 is transmitted through the moisture preventing portion 12 and the sensor portion 11 and then enters the scintillator 10. In order that attenuation should be reduced in the radiation reaching the scintillator 10, the radiation absorption of the moisture preventing portion 12 is preferably as low as possible, and is at least lower than the absorption in the above-mentioned insulating substrate having been used in the fabrication of the sensor portion 11 and then peeled off. Similarly to the absorbing power for the top plate 5 of the casing 4 set forth in JIS Z 9405:1998 guide, the moisture preventing portion 12 preferably has a 60-keV X-ray absorbing power lower than 1.8 mm in aluminum equivalent. Here, in the definition of the aluminum equivalent, an aluminum plate containing aluminum of 99% or higher as set forth in JIS H 4000 No. 1100 is used. Then, in a situation that the aluminum plate or the moisture preventing portion 12 is placed at a distance of 500 mm from an X-ray source, the dosage is measured by a dosimeter located at a distance of 1000 mm from the X-ray source. Then, the aluminum equivalent is calculated on the basis of this measurement.

Further, as described above, the CsI constituting the scintillator 10 has a tendency that the sensitivity decreases with increasing temperature. The photoelectric conversion elements 26 of the sensor portion 11 also have temperature dependence. Heat from a test object (e.g., an image-taking target part of a patient) placed on the top plate 5 is transmitted through the top plate 5 and the adhesive layer 16 to the moisture preventing portion 12. Thus, preferably, the moisture preventing portion 12 has a higher thermal conductivity than, for example, the glass material serving as the above-mentioned insulating substrate. According to this, the heat transmitted to the moisture preventing portion 12 is diffused rapidly. This avoids: a local temperature rise in the scintillator 10 or the sensor portion 11; and a local sensitivity decrease in the scintillator 10 and a local temperature drift in the sensor portion 11 which could be caused by the above-mentioned temperature rise. This further avoids the occurrence of image non-uniformity. Further, preferably, the moisture preventing portion 12 is porous in the surface. This suppresses heat transmission from the top plate 5, and suppresses a temperature rise in the scintillator 10 or the sensor portion 11.

Further, in medical application, the front face of the cassette 1 is cleaned with alcohol. Then, when alcohol enters the casing 4, a concern of degradation of the sensor portion 11 and the scintillator 10 arises. Thus, preferably, the moisture preventing portion 12 has an alcohol drying effect.

From the perspectives of radiation absorbing power, high heat conductivity, thermal insulation property, and alcohol drying effect, the moisture absorbing material constituting the moisture preventing portion 12 is preferably composed of alumina, silica gel, or the like.

Further, in the present example, the moisture preventing portion 12 is pressed against the sensor portion 11 in association with the sealing by the protective film 15. Thus, a thin air layer is provided between the moisture preventing portion 12 and the sensor portion 11. The presence of the air layer increases the reflectivity in the surface on the moisture preventing portion 12 side of the sensor portion 11 which depends on the refractive index difference from the air. Thus, the fluorescence from the scintillator 10 temporarily transmitted through the sensor portion 11 without photoelectric conversion in the photoelectric conversion elements 26 is returned to the photoelectric conversion elements 26 again. This improves the sensitivity.

As described above, since the insulating substrate having supported the sensor portion is peeled off, the sensor portion 11 of thin-film type is supported by the scintillator 10. This avoids absorption of radiation by the insulating substrate, and hence avoids attenuation of the radiation entering the scintillator 10. This improves the sensitivity of the cassette 1. Further, the moisture preventing portion 12 is provided on the rear face of the sensor portion 11 exposed when the insulating substrate is peeled off. This suppresses degradation of the sensor portion 11 and the scintillator 10 caused by moisture, and hence improves the image quality and the durability.

Figure 7:
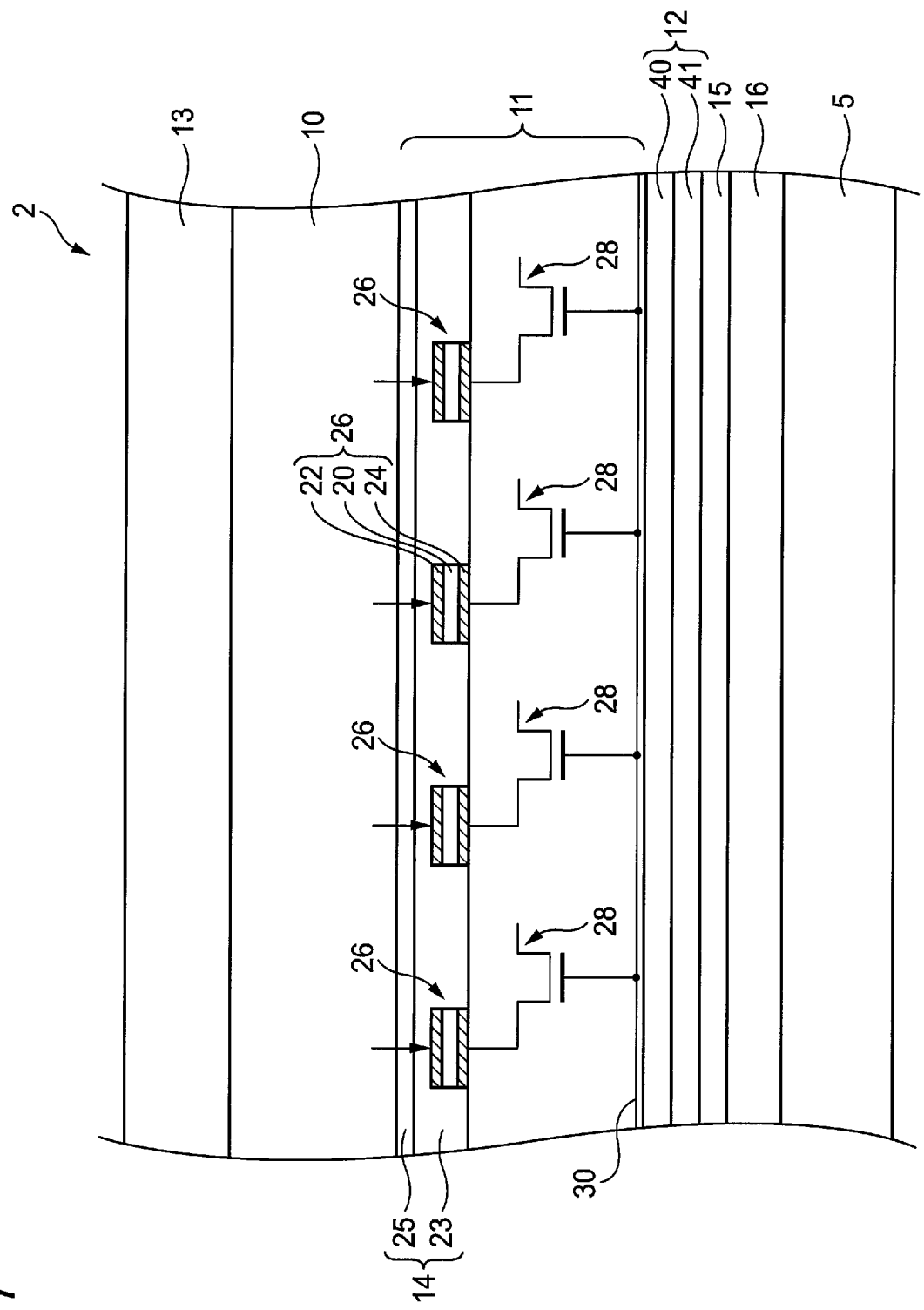
FIG. 7 is a diagram schematically showing a configuration of a modification to a detection portion shown in FIG. 2.

FIG. 7 shows a modification to the detection portion 2.

In the detection portion 2 shown in FIG. 7, the moisture preventing portion 12 is constructed from two layers consisting of a moisture non-permeating layer 40 and a moisture absorbing layer 41. The moisture non-permeating layer 40 is arranged on the side pressed against the sensor portion 11 in association with the sealing by the protective film 15. Further, the moisture absorbing layer 41 is arranged on the side bonded to the top plate 5 with the adhesive layer 16 in between.

The moisture non-permeating layer 40 is provided such as to cover a region including at least the rear face center part of the sensor portion 11 and, preferably, is provided such as to cover the entire rear face of the sensor portion 11 as in the illustrated example. Since the moisture non-permeating layer 40 is provided such as to cover a region including at least the rear face center part of the sensor portion 11, this suppresses the entering of moisture into the center part of the scintillator 10 playing a major role in radiation image detection and hence avoids the progress of deliquescence beginning at the center part of the scintillator 10.

The moisture absorbing layer 41 may be appropriately provided sparsely on the moisture non-permeating layer 40 such as to partly cover the rear face of the sensor portion 11. However, preferably, as in the illustrated example, the moisture absorbing layer 41 is provided such as to cover the entire rear face of the sensor portion 11.

In some cases, the moisture collected by the moisture absorbing layer 41 is slightly released from the moisture absorbing layer 41 in association with an environmental change. Thus, if the sensor portion 11 were in contact with the moisture absorbing layer 41, the released moisture rapidly could enter the sensor portion 11. However, since the moisture non-permeating layer 40 is provided between the moisture absorbing layer 41 and the sensor portion 11, the entering of moisture into the sensor portion 11 is avoided more reliably.

It is preferable that the moisture non-permeating layer 40 has a satisfactory moisture prevention property and has reflectivity with respect to the fluorescence from the scintillator 10. Thus, a metal foil or a metal-deposited film is preferably employed that is fabricated from Al or Al alloy containing an element selected from Mg, Cr, Zr, Ti, and Mn. Then, a firm oxide film is formed on the surface thereof so that insulation is obtained. Since the moisture non-permeating layer 40 in contact with the sensor portion 11 has reflectivity, the fluorescence from the scintillator 10 temporarily transmitted through the sensor portion 11 without photoelectric conversion in the photoelectric conversion elements 26 is returned to the photoelectric conversion elements 26 again. This improves the sensitivity.

Since the aforementioned radiological image detection apparatus can detect a radiological image with high sensitivity and high definition, it can be installed and used in an X-ray imaging apparatus for the purpose of medical diagnosis, such as a mammography apparatus, required to detect a sharp image with a low dose of radiation, and other various apparatuses. For example, the radiological image detection apparatus is applicable to an industrial X-ray imaging apparatus for nondestructive inspection, or an apparatus for detecting particle rays (α-rays, β-rays, γ-rays) other than electromagnetic waves. The radiological image detection apparatus has a wide range of applications.

Description will be made below on materials which can be used for constituent members of the sensor portion 11.

[Photoelectric Conversion Element]

Inorganic semiconductor materials such as amorphous silicon are often used for the photoconductive layer 20 (see FIG. 1) of the aforementioned photoelectric conversion elements 26. For example, any OPC (Organic Photoelectric Conversion) material disclosed in JP-A-2009-32854 may be used. A film formed out of the OPC material (hereinafter referred to as OPC film) may be used as the photoconductive layer 20. The OPC film contains an organic photoelectric conversion material, absorbing light emitted from a phosphor layer and generating electric charges in accordance with the absorbed light. Such an OPC film containing an organic photoelectric conversion material has a sharp absorption spectrum in a visible light range. Thus, electromagnetic waves other than light emitted from the phosphor layer are hardly absorbed by the OPC film, but noise generated by radiation such as X-rays absorbed by the OPC film can be suppressed effectively.

It is preferable that the absorption peak wavelength of the organic photoelectric conversion material forming the OPC film is closer to the peak wavelength of light emitted by the phosphor layer in order to more efficiently absorb the light emitted by the phosphor layer. Ideally, the absorption peak wavelength of the organic photoelectric conversion material agrees with the peak wavelength of the light emitted by the phosphor layer. However, if the difference between the absorption peak wavelength of the organic photoelectric conversion material and the peak wavelength of the light emitted by the phosphor layer is small, the light emitted by the phosphor layer can be absorbed satisfactorily. Specifically, the difference between the absorption peak wavelength of the organic photoelectric conversion material and the peak wavelength of the light emitted by the phosphor layer in response to radioactive rays is preferably not larger than 10 nm, more preferably not larger than 5 nm.

Examples of the organic photoelectric conversion material that can satisfy such conditions include arylidene-based organic compounds, quinacridone-based organic compounds, and phthalocyanine-based organic compounds. For example, the absorption peak wavelength of quinacridone in a visible light range is 560 nm. Therefore, when quinacridone is used as the organic photoelectric conversion material and CsI(Tl) is used as the phosphor layer material, the aforementioned difference in peak wavelength can be set within 5 nm so that the amount of electric charges generated in the OPC film can be increased substantially to the maximum.

At least a part of an organic layer provided between the bias electrode 22 and the charge collection electrode 24 can be formed out of an OPC film. More specifically, the organic layer can be formed out of a stack or a mixture of a portion for absorbing electromagnetic waves, a photoelectric conversion portion, an electron transport portion, an electron hole transport portion, an electron blocking portion, an electron hole blocking portion, a crystallization prevention portion, electrodes, interlayer contact improvement portions, etc.

Preferably the organic layer contains an organic p-type compound or an organic n-type compound. An organic p-type semiconductor (compound) is a donor-type organic semiconductor (compound) as chiefly represented by an electron hole transport organic compound, meaning an organic compound having characteristic to easily donate electrons. More in detail, of two organic materials used in contact with each other, one with lower ionization potential is called the donor-type organic compound. Therefore, any organic compound may be used as the donor-type organic compound as long as the organic compound having characteristic to donate electrons. Examples of the donor-type organic compound that can be used include a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a fused aromatic carbocyclic compound (naphthalene derivative, anthracene derivative, phenanthrene derivative, tetracene derivative, pyrene derivative, perylene derivative, fluoranthene derivative), a metal complex having a nitrogen-containing heterocyclic compound as a ligand, etc. The donor-type organic semiconductor is not limited thereto but any organic compound having lower ionization potential than the organic compound used as an n-type (acceptor-type) compound may be used as the donor-type organic semiconductor.

The n-type organic semiconductor (compound) is an acceptor-type organic semiconductor (compound) as chiefly represented by an electron transport organic compound, meaning an organic compound having characteristic to easily accept electrons. More specifically, when two organic compounds are used in contact with each other, one of the two organic compounds with higher electron affinity is the acceptor-type organic compound. Therefore, any organic compound may be used as the acceptor-type organic compound as long as the organic compound having characteristic to accept electrons. Examples thereof include a fused aromatic carbocyclic compound (naphthalene derivative, anthracene derivative, phenanthrene derivative, tetracene derivative, pyrene derivative, perylene derivative, fluoranthene derivative), a 5- to 7-membered heterocyclic compound containing a nitrogen atom, an oxygen atom or a sulfur atom (e.g. pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, tribenzazepine etc.), a polyarylene compound, a fluorene compound, a cyclopentadiene compound, a silyl compound, and a metal complex having a nitrogen-containing heterocyclic compound as a ligand. The acceptor-type organic semiconductor is not limited thereto. Any organic compound may be used as the acceptor-type organic semiconductor as long as the organic compound has higher electron affinity than the organic compound used as the donor-type organic compound.

As for p-type organic dye or n-type organic dye, any known dye may be used. Preferred examples thereof include cyanine dyes, styryl dyes, hemicyanine dyes, merocyanine dyes (including zero-methine merocyanine (simple merocyanine)), trinuclear merocyanine dyes, tetranuclear merocyanine dyes, rhodacyanine dyes, complex cyanine dyes, complex merocyanine dyes, alopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugide dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex dyes, and fused aromatic carbocyclic dyes (naphthalene derivative, anthracene derivative, phenanthrene derivative, tetracene derivative, pyrene derivative, perylene derivative, fluoranthene derivative).

A photoelectric conversion film (photosensitive layer) which has a layer of a p-type semiconductor and a layer of an n-type semiconductor between a pair of electrodes and at least one of the p-type semiconductor and the n-type semiconductor is an organic semiconductor and in which a bulk heterojunction structure layer including the p-type semiconductor and the n-type semiconductor is provided as an intermediate layer between those semiconductor layers may be used preferably. The bulk heterojunction structure layer included in the photoelectric conversion film can cover the defect that the carrier diffusion length of the organic layer is short. Thus, the photoelectric conversion efficiency can be improved. The bulk heterojunction structure has been described in detail in JP-A-2005-303266.

It is preferable that the photoelectric conversion film is thicker in view of absorption of light from the phosphor layer. The photoelectric conversion film is preferably not thinner than 30 nm and not thicker than 300 nm, more preferably not thinner than 50 nm and not thicker than 250 nm, particularly more preferably not thinner than 80 nm and not thicker than 200 nm in consideration of the ratio which does make any contribution to separation of electric charges.

As for any other configuration about the aforementioned OPC film, for example, refer to description in JP-A-2009-32854.

[Switching Device]

Inorganic semiconductor materials such as amorphous silicon are often used for an active layer of each switching device 28. However, any organic material, for example, as disclosed in JP-A-2009-212389, may be used. Although the organic TFT may have any type of structure, a field effect transistor (FET) structure is the most preferable. In the FET structure, a gate electrode is provided on a part of an upper surface of an insulating substrate, and an insulator layer is provided to cover the electrode and touch the substrate in the other portion than the electrode. Further, a semiconductor active layer is provided on an upper surface of the insulator layer, and a transparent source electrode and a transparent drain electrode are disposed on a part of an upper surface of the semiconductor active layer and at a distance from each other. This configuration is called a top contact type device. However, a bottom contact type device in which a source electrode and a drain electrode are disposed under a semiconductor active layer may be also used preferably. In addition, a vertical transistor structure in which a carrier flows in the thickness direction of an organic semiconductor film may be used.

(Active Layer)

Organic semiconductor materials mentioned herein are organic materials showing properties as semiconductors. Examples of the organic semiconductor materials include p-type organic semiconductor materials (or referred to as p-type materials simply or as electron hole transport materials) which conduct electron holes (holes) as carriers, and n-type organic semiconductor materials (or referred to as n-type materials simply or as electrode transport materials) which conduct electrons as carriers, similarly to a semiconductor formed out of an inorganic material. Of the organic semiconductor materials, lots of p-type materials generally show good properties. In addition, p-type transistors are generally excellent in operating stability as transistors under the atmosphere. Here, description here will be made on a p-type organic semiconductor material.

One of properties of organic thin film transistors is a carrier mobility (also referred to as mobility simply) µ which indicates the mobility of a carrier in an organic semiconductor layer. Although preferred mobility varies in accordance with applications, higher mobility is generally preferred. The mobility is preferably not lower than $1.0*10^{-7}$ cm$^2$/Vs, more preferably not lower than $1.0*10^{-6}$ cm$^2$/Vs, further preferably not lower than $1.0*10^{-5}$ cm$^2$/Vs. The mobility can be obtained by properties or TOF (Time Of Flight) measurement when the field effect transistor (FET) device is manufactured.

The p-type organic semiconductor material may be either a low molecular weight material or a high molecular weight material, but preferably a low molecular weight material. Lots of low molecular weight materials typically show excellent properties due to easiness in high purification because various refining processes such as sublimation refining, recrystallization, column chromatography, etc. can be applied thereto, or due to easiness in formation of a highly ordered crystal structure because the low molecular weight materials have a fixed molecular structure. The molecular weight of the low molecular weight material is preferably not lower than 100 and not higher than 5,000, more preferably not lower than 150 and not higher than 3,000, further more preferably not lower than 200 and not higher than 2,000.

A phthalocyanine compound or a naphthalocyanine compound may be exemplified as such a p-type organic semiconductor material. A specific example thereof is shown as follows. M represents a metal atom, Bu represents a butyl group, Pr represents a propyl group, Et represents an ethyl group, and Ph represents a phenyl group.

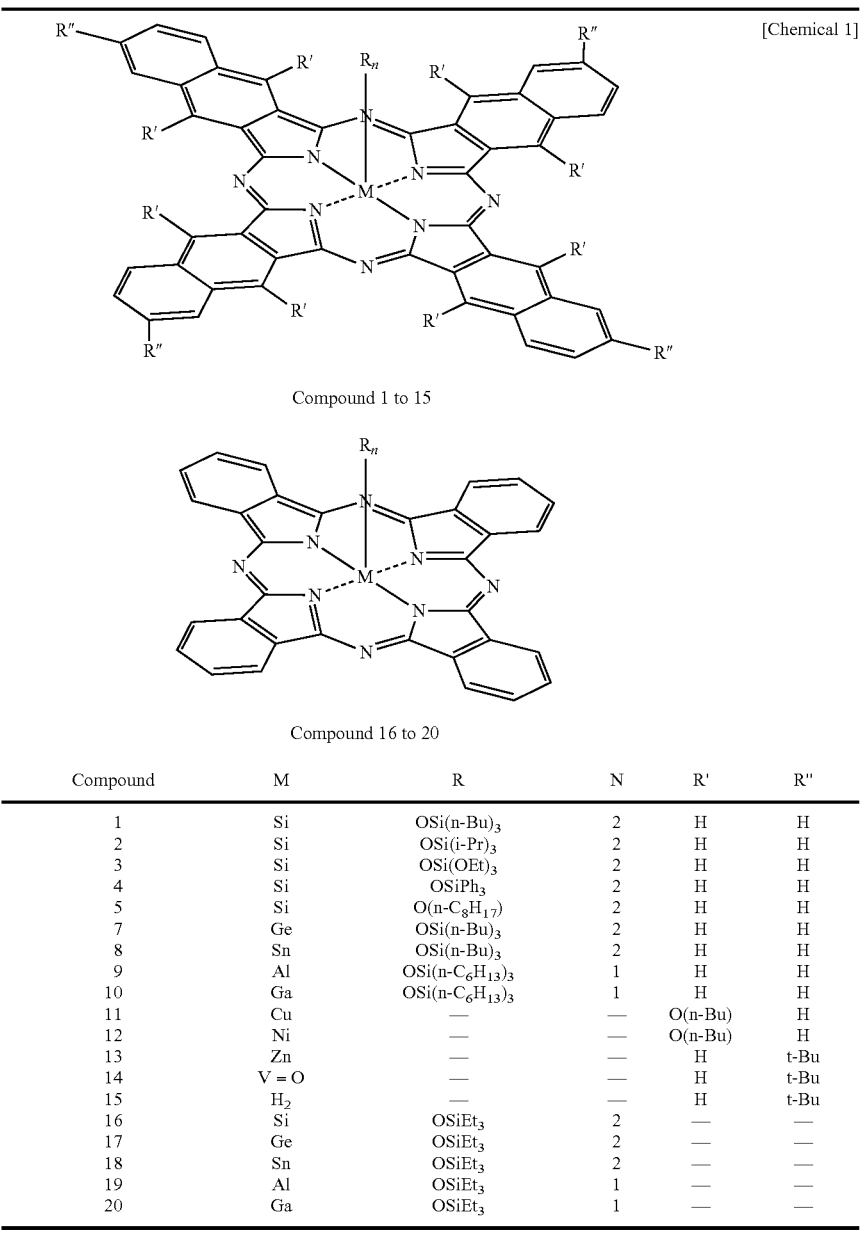

Compound 1 to 15

Compound 16 to 20

| Compound | M | R | N | R' | R" |
|---|---|---|---|---|---|
| 1 | Si | OSi(n-Bu)$_3$ | 2 | H | H |
| 2 | Si | OSi(i-Pr)$_3$ | 2 | H | H |
| 3 | Si | OSi(OEt)$_3$ | 2 | H | H |
| 4 | Si | OSiPh$_3$ | 2 | H | H |
| 5 | Si | O(n-C$_8$H$_{17}$) | 2 | H | H |
| 7 | Ge | OSi(n-Bu)$_3$ | 2 | H | H |
| 8 | Sn | OSi(n-Bu)$_3$ | 2 | H | H |
| 9 | Al | OSi(n-C$_6$H$_{13}$)$_3$ | 1 | H | H |
| 10 | Ga | OSi(n-C$_6$H$_{13}$)$_3$ | 1 | H | H |
| 11 | Cu | — | — | O(n-Bu) | H |
| 12 | Ni | — | — | O(n-Bu) | H |
| 13 | Zn | — | — | H | t-Bu |
| 14 | V = O | — | — | H | t-Bu |
| 15 | H$_2$ | — | — | H | t-Bu |
| 16 | Si | OSiEt$_3$ | 2 | — | — |
| 17 | Ge | OSiEt$_3$ | 2 | — | — |
| 18 | Sn | OSiEt$_3$ | 2 | — | — |
| 19 | Al | OSiEt$_3$ | 1 | — | — |
| 20 | Ga | OSiEt$_3$ | 1 | — | — |

(Constituent Members of Switching Device Other Than Active Layer)

The material forming the gate electrode, the source electrode or the drain electrode is not limited particularly if it has required electric conductivity. Examples thereof include: transparent electrically conductive oxides such as ITO (indium-doped tin oxide), IZO (indium-doped zinc oxide), SnO$_2$, ATO (antimony-doped tin oxide), ZnO, AZO (aluminum-doped zinc oxide), GZO (gallium-doped zinc oxide), TiO$_2$, FTO (fluorine-doped tin oxide), etc.; transparent electrically conductive polymers such as PEDOT/PSS (poly(3,4-ethylenedioxythiophene)/polystyrenesulfonate); carbon materials such as carbon nanotube; etc. These electrode materials may be formed into films, for example, by a vacuum deposition method, sputtering, a solution application method, etc.

The material used for the insulating layer is not limited particularly as long as it has required insulating effect. Examples thereof include: inorganic materials such as silicon dioxide, silicon nitride, alumina, etc.; and organic materials such as polyester (PEN (polyethylene naphthalate), PET (polyethylene terephthalate) etc.), polycarbonate, polyimide, polyamide, polyacrylate, epoxy resin, polyparaxylylene resin, novolak resin, PVA (polyvinyl alcohol), PS (polystyrene), etc. These insulating film materials may be formed into films, for example, by a vacuum deposition method, sputtering, a solution application method, etc.

As for any other configuration about the aforementioned organic TFT, for example, refer to the description in JP-A-2009-212389.

In addition, for example, amorphous oxide disclosed in JP-A-2010-186860 may be used for the active layer of the switching devices 28. Here, description will be made on an amorphous oxide containing active layer belonging to an FET transistor disclosed in JP-A-2010-186860. The active layer serves as a channel layer of the FET transistor where electrons or holes can move.

The active layer is configured to contain an amorphous oxide semiconductor. The amorphous oxide semiconductor can be formed into a film at a low temperature. Thus, the amorphous oxide semiconductor can be formed preferably on a flexible substrate. The amorphous oxide semiconductor used for the active layer is preferably of amorphous oxide containing at least one kind of element selected from a group consisting of In, Sn, Zn and Cd, more preferably of amorphous oxide containing at least one kind of element selected from a group consisting of In, Sn and Zn, further preferably of amorphous oxide containing at least one kind of element selected from a group consisting of In and Zn.

Specific examples of the amorphous oxide used for the active layer include $In_2O_3$, ZnO, $SnO_2$, CdO, Indium-Zinc-Oxide (IZO), Indium-Tin-Oxide (ITO), Gallium-Zinc-Oxide (GZO), Indium-Gallium-Oxide (IGO), and Indium-Gallium-Zinc-Oxide (IGZO).

It is preferable that a vapor phase film formation method targeting at a polycrystal sinter of the oxide semiconductor is used as a method for forming the active layer. Of vapor phase film formation methods, a sputtering method or a pulse laser deposition (PLD) method is suitable. Further, the sputtering method is preferred in view from mass productivity. For example, the active layer is formed by an RF magnetron sputtering deposition method with a controlled degree of vacuum and a controlled flow rate of oxygen.

By a known X-ray diffraction method, it can be confirmed that the active layer formed into a film is an amorphous film. The composition ratio of the active layer is obtained by an RBS (Rutherford Backscattering Spectrometry) method.

In addition, the electric conductivity of the active layer is preferably lower than $10^2$ $Scm^{-1}$ and not lower than $10^{-4}$ $Scm^{-1}$, more preferably lower than $10^2$ $Scm^{-1}$ and not lower than $10^{-1}$ $Scm^{-1}$. Examples of the method for adjusting the electric conductivity of the active layer include an adjusting method using oxygen deficiency, an adjusting method using a composition ratio, an adjusting method using impurities, and an adjusting method using an oxide semiconductor material, as known.

As for any other configuration about the aforementioned amorphous oxide, for example, refer to description in JP-A-2010-186860.

[Flattening Layer and Adhesive Layer]

The flattening layer 23 and the adhesive layer 25 serving as the resin layer 14 for optically linking the scintillator 10 with the sensor portion 11 are not limited to particular ones as long as the fluorescence from the scintillator 10 is allowed to reach the sensor portion 11 without attenuation. The flattening layer 23 may be composed of resin such as polyimide and parylene. However, preferably, polyimide is employed that has a satisfactory film-fabrication property. The adhesive layer 25 may be composed of: adhesive such as UV curing adhesive, heat setting adhesive, room-temperature hardening type adhesive, and hot melt type adhesive; pressure sensitive adhesive such as rubber pressure sensitive adhesive, silicone pressure sensitive adhesive, and acrylic pressure sensitive adhesive; or a double-sided adhesive/pressure sensitive adhesive sheet whose two sides are provided with such adhesive or pressure sensitive adhesive. Here, from the perspective of the sharpness of the image, preferable adhesive is one composed of low-viscosity epoxy resin which allows formation of a sufficiently thin adhesive layer in comparison with the element size. Further, preferable pressure sensitive adhesive is acrylic pressure sensitive adhesive which is hardly degraded by light or oxidization.

The specification discloses the following radiological image detection apparatuses and methods of manufacturing the radiological image detection apparatuses.

(1) A radiological image detection apparatus includes: a phosphor which contains fluorescent material emitting fluorescence in response to radiation exposure; a sensor portion of thin-film type that is provided adjacent to a radiation entering side of the phosphor and supported by the phosphor and that detects fluorescence emitted by the phosphor; and a moisture preventing portion that covers at least a part of a rear face opposite to a phosphor side of the sensor portion so as to suppress entering of moisture into the sensor portion.

(2) In the radiological image detection apparatus according to (1), the moisture preventing portion may cover a center part of the phosphor that overlaps an effective imaging region of the sensor portion.

(3) In the radiological image detection apparatus according to (1) or (2), the moisture preventing portion may have a 60-keV X-ray absorbing power lower than 1.8 mm in aluminum equivalent.

(4) In the radiological image detection apparatus according to (1) or (2), the moisture preventing portion may include: a moisture non-permeating layer in contact with the rear face of the sensor portion; and a moisture absorbing layer formed on the moisture non-permeating layer.

(5) In the radiological image detection apparatus according to (4), the moisture non-permeating layer may cover the entirety of the rear face of the sensor portion.

(6) In the radiological image detection apparatus according to (5), the moisture non-permeating layer may have reflectivity with respect to the fluorescence.

(7) In the radiological image detection apparatus according to claim 6), the moisture non-permeating layer may be made of metal.

(8) In the radiological image detection apparatus according to (1) or (2), an air layer may be provided between the moisture preventing portion and the sensor portion.

(9) The radiological image detection apparatus according to (1) or (2), may include a casing that accommodates a stack constructed by integrating the phosphor, the sensor portion, and the moisture preventing portion, in which the stack is provided in such a manner that the moisture preventing portion is in close contact with the rear face of a top plate of the casing onto which a test object is placed, and the moisture preventing portion has a thermal conductivity higher than a glass material.

(10) In the radiological image detection apparatus according to (1) or (2), the moisture preventing portion may be porous in the surface thereof.

(11) In the radiological image detection apparatus according to (1) or (2), the moisture preventing portion may be formed from alumina or silica gel.

(12) In the radiological image detection apparatus according to (1) or (2), the phosphor may include a columnar portion including a group of columnar crystals which are obtained by growing crystals of the fluorescent material into columnar shapes.

(13) In the radiological image detection apparatus according to (1) or (2), the phosphor may include a non-columnar portion including a group of non-columnar crystals of the fluorescent material; and the non-columnar portion may be provided on a side opposite to a sensor side of the phosphor.

(14) In the radiological image detection apparatus according to (1) or (2), the fluorescent material may be CsI:Tl.

(15) The radiological image detection apparatus according to (9), may further includes: a protective film that seals the stack.

(16) In the radiological image detection apparatus according to (15), a surface of the sealed stack on a moisture preventing side may be bonded to the top plate with an adhesive layer in between.

(17) A method of manufacturing the radiological image detection apparatus according to (1), includes: bonding the phosphor to a sensor panel constructed such that the moisture preventing portion and the sensor portion are provided in this order on a substrate; and peeling off the substrate.

(18) A method of manufacturing the radiological image detection apparatus according to (1), includes: bonding the phosphor to a sensor panel constructed such that the sensor portion provided on a substrate; peeling off the substrate; and forming the moisture preventing portion onto a front face of the sensor portion exposed when the substrate is peeled off.

(19) In the method of manufacturing the radiological image detection apparatus according to (17) or (18), the moisture preventing portion may have a lower radiation absorption than the substrate peeled off from the sensor panel.

(20) In the method of manufacturing the radiological image detection apparatus according to (19), the moisture preventing portion may have a 60-keV X-ray absorbing power lower than 1.8 mm in aluminum equivalent.

What is claimed is:

1. A radiological image detection apparatus comprising:
    a phosphor which contains fluorescent material emitting fluorescence in response to radiation exposure;
    a sensor portion of thin-film type that is provided adjacent to a radiation entering side of the phosphor and supported by the phosphor and that detects fluorescence emitted by the phosphor; and
    a moisture preventing portion that covers at least a part of a rear face opposite to a phosphor side of the sensor portion so as to suppress entering of moisture into the sensor portion;
    wherein in order from the radiation entering side, the moisture preventing portion, the sensor portion and the phosphor are arranged at the time of image-taking.

2. The radiological image detection apparatus according to claim 1, wherein:
    the moisture preventing portion covers a center part of the phosphor that overlaps an effective imaging region of the sensor portion.

3. The radiological image detection apparatus according to claim 1, wherein:
    the moisture preventing portion has a 60-keV X-ray absorbing power lower than 1.8 mm in aluminum equivalent.

4. The radiological image detection apparatus according to claim 1, wherein:
    the moisture preventing portion includes: a moisture non-permeating layer in contact with the rear face of the sensor portion; and a moisture absorbing layer formed on the moisture non-permeating layer.

5. The radiological image detection apparatus according to claim 4, wherein:
    the moisture non-permeating layer covers the entirety of the rear face of the sensor portion.

6. The radiological image detection apparatus according to claim 5, wherein:
    the moisture non-permeating layer has reflectivity with respect to the fluorescence.

7. The radiological image detection apparatus according to claim 6, wherein:
    the moisture non-permeating layer is made of metal.

8. The radiological image detection apparatus according to claim 1, wherein:
    an air layer is provided between the moisture preventing portion and the sensor portion.

9. The radiological image detection apparatus according to claim 1, comprising:
    a casing that accommodates a stack constructed by integrating the phosphor, the sensor portion, and the moisture preventing portion, wherein:
    the stack is provided in such a manner that the moisture preventing portion is in close contact with the rear face of a top plate of the casing onto which a test object is placed; and
    the moisture preventing portion has a thermal conductivity higher than a glass material.

10. The radiological image detection apparatus according to claim 9, further comprising:
    a protective film that seals the stack.

11. The radiological image detection apparatus according to claim 10, wherein:
    a surface of the sealed stack on a moisture preventing side is bonded to the top plate with an adhesive layer in between.

12. The radiological image detection apparatus according to claim 1, wherein:
    the moisture preventing portion is porous in the surface thereof.

13. The radiological image detection apparatus according to claim 1, wherein:
    the moisture preventing portion is formed from alumina or silica gel.

14. The radiological image detection apparatus according to claim 1, wherein:
    the phosphor includes a columnar portion including a group of columnar crystals which are obtained by growing crystals of the fluorescent material into columnar shapes.

15. The radiological image detection apparatus according to claim 1, wherein:
    the phosphor includes a non-columnar portion including a group of non-columnar crystals of the fluorescent material; and
    the non-columnar portion is provided on a side opposite to a sensor side of the phosphor.

16. The radiological image detection apparatus according to claim 1, wherein:
    the fluorescent material is CsI:Tl.

17. A method of manufacturing the radiological image detection apparatus according to claim 1, comprising:
    bonding the phosphor to a sensor panel constructed such that the moisture preventing portion and the sensor portion are provided in this order on a substrate; and
    peeling off the substrate.

18. The method of manufacturing the radiological image detection apparatus according to claim 17, wherein:
    the moisture preventing portion has a lower radiation absorption than the substrate peeled off from the sensor panel.

19. The method of manufacturing the radiological image detection apparatus according to claim 18, wherein:
    the moisture preventing portion has a 60-keV X-ray absorbing power lower than 1.8 mm in aluminum equivalent.

20. A method of manufacturing the radiological image detection apparatus according to claim 1, comprising:
bonding the phosphor to a sensor panel constructed such that the sensor portion provided on a substrate;
peeling off the substrate; and
forming the moisture preventing portion onto a front face of the sensor portion exposed when the substrate is peeled off.

21. The radiological image detection apparatus according to claim 1, wherein the moisture preventing portion is formed from a moisture absorbing material having insulation.

22. The radiological image detection apparatus according to claim 1, wherein the moisture preventing portion is in contact with gate lines of the sensor portion.

23. A radiological image detection apparatus comprising:
a phosphor which contains fluorescent material emitting fluorescence in response to radiation exposure;
a sensor portion of thin-film type that is provided adjacent to a radiation entering side of the phosphor and supported by the phosphor and that detects fluorescence emitted by the phosphor; and
a moisture preventing portion that covers at least a part of a rear face opposite to a phosphor side of the sensor portion so as to suppress entering of moisture into the sensor portion;
wherein the moisture preventing portion is in contact with gate lines of the sensor portion.

* * * * *